(12) United States Patent
Nakamura et al.

(10) Patent No.: US 6,632,476 B2
(45) Date of Patent: Oct. 14, 2003

(54) SUBSTRATE PROCESSING METHOD AND SUBSTRATE PROCESSING APPARATUS

(75) Inventors: Hiroko Nakamura, Yokohama (JP); Hisashi Kaneko, Fujisawa (JP); Tetsuo Matsuda, Tano-gun (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 219 days.

(21) Appl. No.: 09/805,034

(22) Filed: Mar. 14, 2001

(65) Prior Publication Data

US 2001/0033894 A1 Oct. 25, 2001

(30) Foreign Application Priority Data

Mar. 15, 2000 (JP) ........................................ 2000-071968

(51) Int. Cl.⁷ .............................. B05D 1/18; B05D 3/12; B05C 3/02; B05C 11/08
(52) U.S. Cl. ...................... 427/240; 427/421; 427/425; 427/430.1; 427/443.2; 118/52; 118/320; 118/321; 118/323; 118/423; 118/428; 438/758
(58) Field of Search ................................ 427/240, 425, 427/430.1, 443.2, 421; 118/52, 320, 400, 321, 323, 428, 423; 438/758

(56) References Cited

U.S. PATENT DOCUMENTS

| 5,826,129 A | * | 10/1998 | Hasebe et al. | ............... | 396/611 |
| 5,930,549 A | * | 7/1999 | Kim et al. | ................... | 396/611 |
| 6,033,135 A | * | 3/2000 | An et al. | ..................... | 396/611 |
| 6,265,323 B1 | * | 7/2001 | Nakamura et al. | .......... | 438/748 |
| 2001/0001703 A1 | * | 5/2001 | Takahashi et al. | ........... | 430/322 |

FOREIGN PATENT DOCUMENTS

| JP | 1-232723 A | * | 9/1989 |
| JP | 2-101467 | | 4/1990 |
| JP | 2-127647 | | 5/1990 |
| JP | 3-108313 A | * | 5/1991 |
| JP | 5-13320 | | 1/1993 |
| JP | 5-347032 | | 12/1993 |
| JP | 11-233406 | | 8/1999 |
| JP | 11-329960 | | 11/1999 |
| JP | 2002-42383 A | * | 2/2002 |

* cited by examiner

Primary Examiner—Shrive P. Beck
Assistant Examiner—Kirsten Crockford Jolley
(74) Attorney, Agent, or Firm—Finnegan, Henderson, Farabow, Garrett & Dunner, L.L.P.

(57) ABSTRACT

After a thin liquid agent film is formed by supplying a liquid agent onto a plate-like developer holder, this liquid agent film and the surface of a substrate are opposed. The liquid agent film and the substrate are brought into contact with each other at a point by declining the substrate and moving it close to the liquid agent film, or by curving the substrate toward the liquid agent film. Then, the substrate is made parallel to the liquid agent film, and the liquid agent is supplied such that the contact area of the liquid agent film spreads over the entire surface by the interfacial tension between the liquid agent film and the substrate. Since a thin liquid agent film can be uniformly formed below the substrate, processing can be performed with a small consumption amount. Additionally, the liquid agent can be supplied to the substrate without holding air.

23 Claims, 7 Drawing Sheets

SUBSTRATE PROCESSING METHOD AND SUBSTRATE PROCESSING APPARATUS

CROSS-REFERENCE TO RELATED APPLICATIONS

This application is based upon and claims the benefit of priority from the prior Japanese Patent Application No. 2000-071968, filed Mar. 15, 2000.

BACKGROUND OF THE INVENTION

The present invention relates to a method and apparatus for fabricating a substrate of, e.g., a semiconductor device or a liquid crystal display and, more particularly, to a substrate processing method and substrate processing apparatus using a liquid agent.

A semiconductor device or a liquid crystal display device is given desired functions by performing various processes on a substrate and finally forming fine patterns. To fabricate such a substrate, not only dry processes using gases but also wet processes using liquid agents are extensively used. For example, a wet process is used in a development step of forming a photosensitive resin pattern used in the fabrication of a fine pattern.

A method of forming a photosensitive resin pattern (resist) by using a wet process will be described below. A film to be processed formed on a silicon or quartz substrate is first coated with a photosensitive resin, and a portion of this photosensitive resin in a desired region is exposed to light by using an exposure mask.

Subsequently, a developer, e.g., an organic solvent or alkaline aqueous solution is used to remove an exposed portion, in the case of a positive resist, or an unexposed portion, in the case of a negative resist, thereby forming a photosensitive resin pattern. This step is called a development step.

A wet process is also used to fabricate a chromium film of a chromium mask for exposure. In this wet process, after a chromium film is formed on a quartz substrate, a photosensitive resin pattern is formed. A portion of the chromium film uncovered with this photosensitive resin pattern is isotropically wet-etched by using a ceric nitrate ammonium solution or the like.

Also, a mixed liquid agent of sulfuric acid and hydrogen peroxide is used to remove unnecessary organic substances sticking to the substrate before fabrication, and to remove the photosensitive resin pattern remaining after the etching process. Native oxide formed when atmospheric oxygen reacts with a silicon substrate is also removed using $NH_4F$ or dilute HF as a liquid agent, since this oxide prevents uniform fabrication. Furthermore, an Au plating solution is used to form a gold film on a silicon wafer.

Conventionally, a developer is supplied by using a nozzle having holes for supplying the developer from above a substrate to be processed. That is, the developer is supplied while a wafer is rotated, so that the supplied developer is spread by the centrifugal force. This method is disclosed in, e.g., Jpn. Pat. Appln. KOKAI Publication No. 5-13320. In this method, the developer is continuously supplied to a portion immediately below the developer supply holes. However, the developer spread by the centrifugal force dissolves resist while spreading on the wafer. Therefore an alkaline component in the developer is consumed and the alkali concentration lowers in a peripheral portion. As a consequence, a CD (critical dimension)/pattern size difference is produced between the portion just below the developer supply holes and the portion away from the developer supply holes on the surface of the substrate to be processed.

From the foregoing, it is desired to supply a developer as a liquid agent film onto a substrate to be processed. However, it is not easy to supply a liquid agent in the form of a film from an upper side of a substrate to be processed. That is, when a liquid agent film is placed on a substrate to be processed, the substrate repels this liquid agent if the contact angle between the substrate and the liquid agent is too large. To prevent this repellent of the liquid agent, it is necessary to supply more amount of liquid agent than the one needed for the processing. Consequently, a large amount of liquid agent is wasted.

In another method of forming a liquid agent film, a liquid agent film holding member is set above a substrate to be processed, and a liquid agent film is formed on the lower surface of this liquid agent film holding member. If, for example, the thickness of a developer film becomes a predetermined value or larger, a liquid agent consisting of this developer unfortunately falls as droplets. To prevent the formation of droplets, the thickness of the developer film must be decreased. As a consequence, enough amount of liquid agent for development can not be obtained.

To solve this problem, it is possible to set a substrate to be processed with its surface to be processed facing down, and place a liquid agent below the substrate. However, the conventionally proposed method is to perform dip development, in which a liquid agent such as a developer is stored in a liquid agent reservoir (e.g., disclosed in Jpn. Pat. Appln. KOKAI Publication No. 2-101467). That is, the method requires a large amount of liquid agent.

Also, in this conventionally proposed method, a substrate to be processed is set parallel to the surface of a liquid agent, and is brought into contact with the liquid agent by lowering the substrate or raising the liquid agent reservoir. When this method is executed, a bubble enters between the substrate and the liquid agent and produces a defect or, even if it does not produce such a defect, produces variations in critical dimensions/pattern size. This bubble is formed because the entire surfaces of the liquid agent and the substrate are not brought into contact with each other at once.

One cause of the formation of a bubble is that air is surrounded with the liquid agent and the substrate because the time at which the liquid agent and the substrate come into contact with each other differs from one place to another. Also, low wettability of the substrate to the liquid agent causes the substrate to repel the liquid agent even when they come into contact with each other. In this case, the liquid agent around the repelled portion sometimes surrounds this repelled portion and forms a bubble.

Furthermore, in this method a liquid agent vessel cannot be easily kept clean and requires a long cleaning time.

A resist which has become soluble dissolves in the development step. This resist sometimes comes in contact with the wall of the vessel and becomes particles. Additionally, the developer is an alkaline aqueous solution. Hence, an alkali component crystallizes by water evaporation or reacts with atmospheric carbon dioxide gas and then a carbonate precipitates. These crystal and carbonate are also the causes of particles and eventually produce defects. Accordingly, it is important to prevent adhesion of these substances and make cleaning easy. A developer reservoir as disclosed in Jpn. Pat. Appln. KOKAI Publication No. 2-101467 has recesses, projections, valves, and the like for supplying and discharging a developer and rinse solution, i.e., has many members difficult to clean. These members cannot be easily kept clean and require a long cleaning time.

BRIEF SUMMARY OF THE INVENTION

The present invention has been made in consideration of the above situation, and has as its object to provide a substrate processing method of supplying a liquid agent so as to perform liquid agent processing with a small consumption amount and bring a liquid agent film into contact with the surface of a substrate to be processed without holding air, and a substrate processing apparatus for carrying out this method.

To achieve the above object, a substrate processing method according to the first aspect of the present invention comprises the steps of supplying a liquid agent onto a plate-like liquid agent holder to form a liquid agent film on the liquid agent holder, setting a substrate to be processed such that a surface to be processed of the substrate opposes the liquid agent film on the liquid agent holder, bringing the surface to be processed of the substrate into contact with the liquid agent film at one point, and gradually spreading the contact from the one point as a starting point until the surface to be processed of the substrate entirely comes in contact with the liquid agent film.

A substrate processing apparatus according to the second aspect of the present invention comprises a plate-like liquid agent holder, a liquid agent supply mechanism configured to supply a liquid agent onto the liquid agent holder to form a liquid agent film on the liquid agent holder, a holding mechanism configured to hold a substrate to be processed such that a surface to be processed of the substrate opposes the liquid agent holder, a first driving mechanism configured to move at least one of the liquid agent holder and the substrate to bring an end portion of the surface to be processed of the substrate into contact with the liquid agent film, and a second driving mechanism configured to move the substrate so as to gradually spread the contact from the end portion of the surface to be processed as a starting point, until the surface to be processed of the substrate entirely comes in contact with the liquid agent film.

A substrate processing apparatus according to the third aspect of the present invention comprises a plate-like liquid agent holder, a liquid agent supply mechanism configured to supply a liquid agent onto the liquid agent holder to form a liquid agent film on the liquid agent holder, a holding mechanism configured to hold a substrate to be processed such that a surface to be processed of the substrate opposes the liquid agent film on the liquid agent holder, a first driving mechanism configured to curve the surface to be processed of the substrate into a shape of a projection and bringing an end portion of the projection of the surface to be processed into contact with the liquid agent film by moving at least one of the liquid agent holder and the substrate, and a second driving mechanism configured to cancel the curve of the substrate so as to gradually spread the contact from the end portion of the projection of the surface to be processed as a starting point, until the surface to be processed of the substrate entirely comes in contact with the liquid agent film.

In the present invention, after a thin liquid agent film is formed by supplying a liquid agent onto a plate-like developer holder, this liquid agent film and the surface to be processed of a substrate to be processed are opposed. A portion of the liquid agent film and a portion of the substrate are brought into contact with each other by declining the substrate and moving it close to the liquid agent film and making the projection close to the liquid agent film, or by curving the substrate toward the liquid agent film. After that, the surface to be processed of the substrate is made parallel to the liquid agent film, and the liquid agent is supplied such that the contact area of the liquid agent film spreads on the entire surface to be processed by the interfacial tension between the liquid agent film and the surface to be processed. Since a thin liquid agent film can be uniformly formed below the substrate, liquid agent processing can be performed with a small consumption amount. Additionally, the liquid agent can be supplied to the substrate without holding air.

To effectively supply the liquid agent without bubbles or processing variation to the substrate to be processed, it is desirable that the contact angle between the surface to be processed and the liquid agent is 40° or less. This contact angle of 40° is achieved by adding a surfactant to the liquid agent or by performing surface treatment on the surface to be processed before processing.

Also, to allow the liquid agent to spread easily on the liquid agent holder, it is desirable to select the materials and the like of the liquid agent and the liquid agent holder such that the contact angle between the liquid agent holder and the liquid agent is 30° or less. When the materials and the like are thus selected, it is possible to decrease the thickness of the liquid film, achieve uniform development, and reduce the liquid agent amount.

The above contact angle can be calculated as follows. The liquid agent is dropped onto the surface to be processed or onto the liquid agent holder such that the diameter of the droplet is 2 mm or less. FIG. 15 shows the section of this droplet. Referring to FIG. 15, θ is the contact angle. This contact angle θ is the angle between the substrate surface and the tangent of the droplet at the portion where the outside circle of the droplet 401 crosses the surface of a substrate 400 to be processed. Assuming the outside circle of the droplet is part of a circle, this contact angle is approximated by $$\theta = 2\theta_1 = 2\tan^{-1}(h/r)$$

where h is the height of the droplet, and r is ½ the base of the droplet.

In the present invention, development is performed by supplying the liquid agent film onto the plate-like liquid agent holder. Therefore, necessary amount of liquid agent in this invention is less than the one in the case of dipping. Also, since the liquid agent holder is a plate, the holder surface has neither projections nor recesses, and this permits easy removal of particles by cleaning. Consequently, the liquid agent holder can be kept clean.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A to 7C are graphs showing resist thickness distributions when negative resists were developed for short time periods by the method of the first embodiment by using a developer diluted to 0.21 N, in which FIGS. 7A, 7B, and 7C show the results when the contact angle was 70°, 40°, and 20°, respectively;

DETAILED DESCRIPTION OF THE INVENTION

Embodiments of the present invention will be described below with reference to the accompanying drawings.

A liquid agent processing method of the present invention will be explained by taking the development of a photosensitive resin by a developer as an example. The apparatus for wafer processing, which is capable of successively coating and developing a photosensitive resin, is connected to an exposure apparatus.

(First Embodiment)

Figure 1:
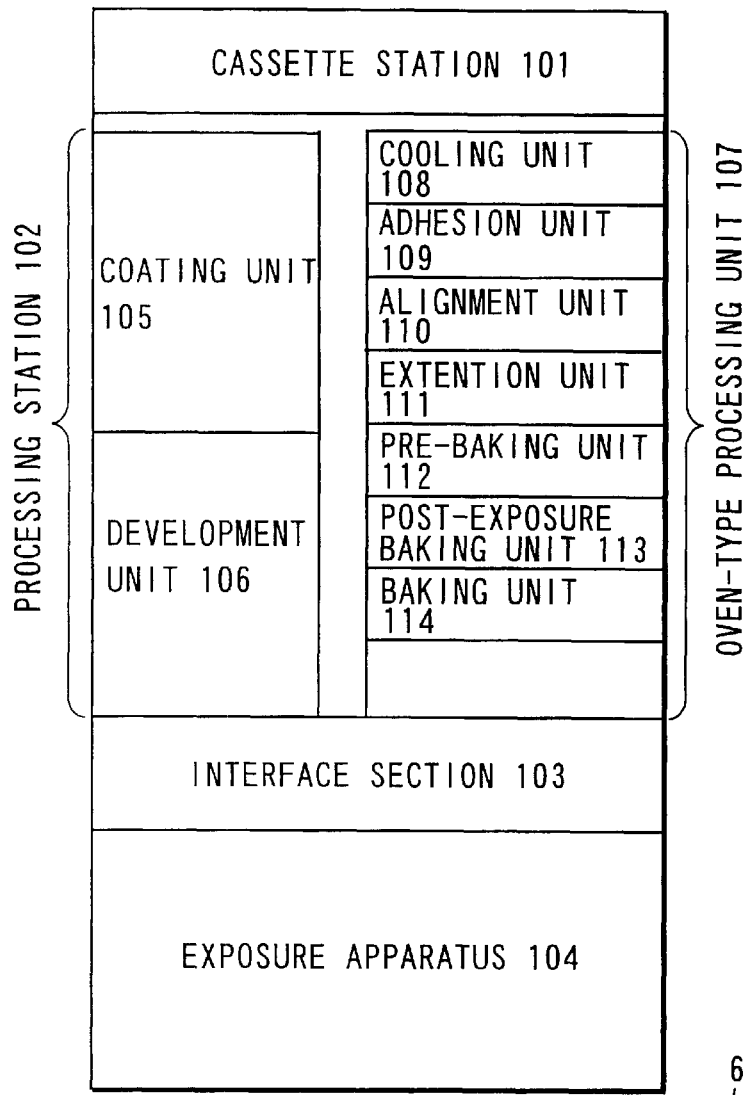
FIG. 1 is a view showing the system configuration of a coating and development apparatus and an exposure apparatus of the present invention.

FIG. 1 is a view showing the system configuration of a coating and development apparatus and an exposure apparatus of the present invention. As shown in FIG. 1, the coating and development apparatus comprises a cassette station 101, a processing station 102, and an interface section 103. This interface station 103 connects an exposure apparatus 104 to the coating and development apparatus.

The cassette station 101 can load or unload, from the outside to this system or from this system to the outside, wafers (not shown) such as semiconductor wafers as substrates to be processed by using a wafer cassette (not shown) which contains a plurality of wafers, e.g., 24 wafers. The cassette station 101 can also load or unload wafers from the wafer cassette into the processing station 102 or from the processing station 102 to the wafer cassette.

In the processing station 102, various single wafer processing units each for performing predetermined processing for one wafer at a time are arranged in predetermined positions. This processing station 102 comprises a coating unit 105, a development unit 106, and an oven-type processing unit 107.

The coating unit 105 is, for example, spinner unit for performing predetermined processing by placing a wafer on a spin chuck in a cup, and is used for coating of, e.g., a resist and an antireflection film. The development unit 106 is used for development of, e.g., a resist.

The oven-type processing unit 107 performs predetermined processing by placing a wafer on a plate. For example, the following units are stacked in this oven-type processing unit 107: a cooling unit 108 for cooling; an adhesion unit 109 for performing so-called hydrophobic processing for increasing the adhesion of a resist; an alignment unit 110 for alignment; an extension unit 111; a pre-baking unit 112 for heating before exposure; a post-exposure baking unit 113 for heating after exposure; and a baking unit 114. The interface unit 103 exchanges wafers between the processing station 102 and the exposure apparatus 104.

Wafers are processed as follows. A predetermined number of wafers are placed in a wafer cassette, and the cassette is set on the cassette station 101. These wafers are transferred from this cassette station 101 to the cooling unit 108 of the oven-type processing unit 107, held in the cooling unit 108 for 40 sec, and transferred to the coating unit 105. In this coating unit 105, each wafer is coated with a 60-nm thick antireflection film. The wafers are then transferred to the baking unit 114 of the oven-type processing unit 107 and heated at 170° C. for 60 sec.

After that, these wafers are transferred to the cooling unit 108 and cooled at 23° C. for 60 sec. The wafers are then transferred to the resist coating unit 105 for resist coating and coated with a 0.4-$\mu$m thick positive photosensitive resin. The coated wafers are transferred to the pre-backing unit 112 of the oven-type processing unit 107 and pre-baked at 140° C. for 90 sec. The wafers are then transferred to the cooling unit 108 and cooled at 23° C. for 60 sec.

Subsequently, the wafers are moved to the interface section 103 and loaded into the exposure apparatus 104. Exposure is performed under normal illumination at NA=0.6 and $\sigma$=0.75. Next, the wafers are loaded into the coating and development apparatus via the interface section 103 and heated at 140° C. for 90 sec in the post-exposure baking unit 113.

The wafers are then transferred from the post-exposure baking unit 113 to the cooling unit of the oven-type processing unit and cooled for 120 sec. These wafers are transferred to the development unit and developed.

Figure 2A:
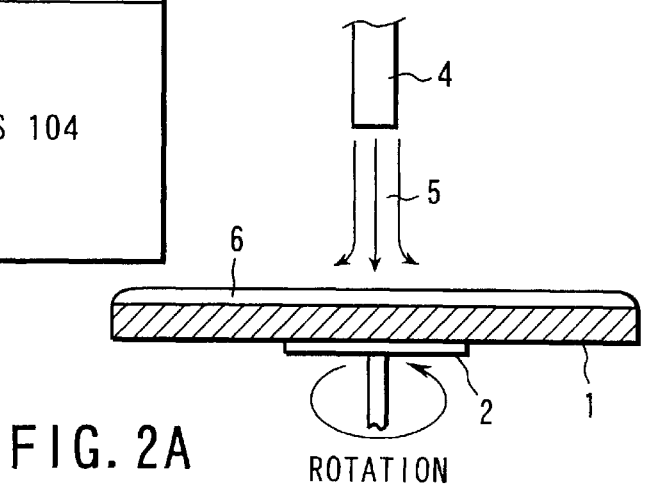
FIGS. 2A and 2B are schematic sectional views of the main components of the development apparatus, for explaining a developer film supply method of the first embodiment of the present invention.
Figure 2B:
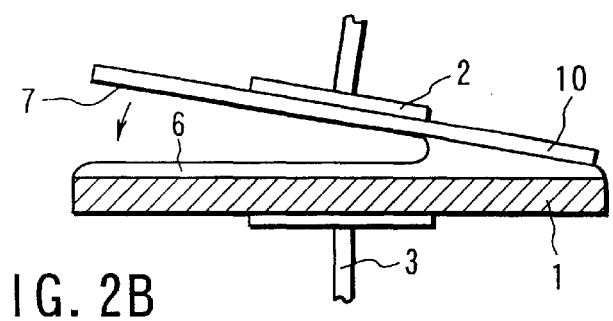
Figure 3:
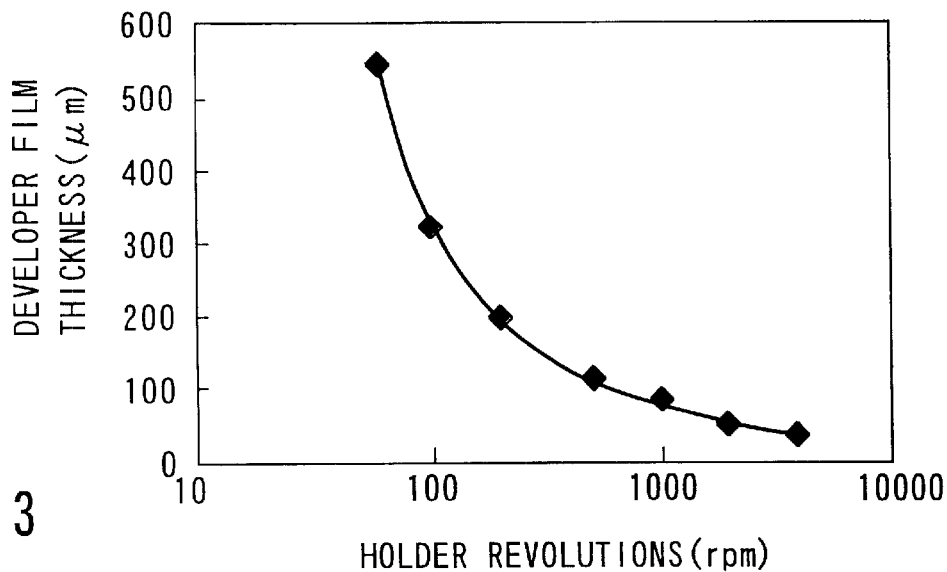
FIG. 3 is a graph showing the dependence of the film thickness of a developer film of the present invention on the holder revolutions.

A method of developing a resist formed on a wafer will be described below with reference to FIGS. 2A, 2B, and 3. FIGS. 2A and 2B are sectional views of the development apparatus of the development unit shown in FIG. 1, in which a wafer is mounted. FIG. 3 is a graph showing the dependence of the developer film thickness on the holder revolutions. In the development unit, a plate-like developer holder 1 is placed. This developer holder 1 is larger than a wafer 10, has a circular shape, and is fixed by a vacuum chuck 2. A rotating mechanism 3 is mounted on the bottom of the vacuum chuck 2 to rotate the developer holder 1.

First, a straight developer supply nozzle 4 moves from an external retraction position to the center of the developer holder 1. As shown in FIG. 2A, while the developer holder 1 is rotated, a developer 5 is supplied from this developer supply nozzle 4 onto the developer holder 1. The developer 5 is spread on the developer holder 1 by the centrifugal force, forming a thin developer film 6 on the developer holder 1. After that, the developer supply nozzle 4 is moved to the retraction position outside the developer holder 1.

From the calculation based on acid-alkaline neutralization reaction, 30 $\mu$m thick developer is needed in order to completely dissolve the resist herein used even when the entire surface of the wafer is exposed.

The thickness of the developer film 6 depends upon the material and revolutions of the developer holder 1. FIG. 3 shows the film thickness ($\mu$m) (ordinate) of a developer film as a function of the revolutions (rpm) (abscissa) of the developer holder when silicon (Si) is used as the developer holder. As shown in FIG. 3, when the revolutions of the developer holder are 4,000 rpm, a 30-$\mu$m thick developer film can be formed. In this embodiment, the developer dropping amount and the revolutions are set to 6 ml (milliliters) and 2,000 rpm, respectively, to obtain a sufficiently large developer film thickness of 50 $\mu$m.

As the contact angle between the developer holder and the developer decreases, it becomes possible to form a thin liquid film by a small number of revolutions and reduce the amount of developer discarded to the outside of the developer holder. If the contact angle between the developer and the developer holder is large, the developer does not form any fine liquid film on the holder even when the developer is spread by the centrifugal force.

Table 1 shows the states of the developer after the developer holder is rotated when the developer supply amount is 6 ml and the revolutions of the developer holder are 2,000 rpm. When the contact angle is 70°, the developer is repelled after the rotation, so no fine liquid film is formed. When the contact angle is 40°, the developer forms a liquid film just after the rotation. However, a pullback phenomenon in which the developer on the edge of the developer holder is pulled to the developer holder center by the surface tension of the developer to leave no developer on the developer holder edge occurs. When the contact angle is 30°, no such phenomenon takes place, and a developer film can be formed on the developer holder.

Accordingly, the contact angle between the developer and the developer holder is desirably substantially 30° or less. Although silicon is used as the developer holder in the first embodiment, another material such as glass which makes a contact angle of 10° with the developer can also be used. It is also possible to add a surfactant to the developer and thereby decrease the contact angle between the developer holder and the developer. Further, it is possible to coat the surface of the developer holder with a hydrophilic film and thereby decrease the contact angle with the developer.

TABLE 1

| Contact angle 70° | Developer is repelled and no liquid film is formed |
| Contact angle 40° | Pullback occurs |
| Contact angle 30° | Liquid film is formed |

Examples of the conventional methods are a method of supplying a developer from the upper side of a wafer to supply the developer on the wafer (e.g., Jpn. Pat. Appln. KOKAI Publication No. 5-13320), and a method of storing a developer in a developer reservoir and bringing the developer in contact with a resist with the resist surface facing down (e.g., Jpn. Pat. Appln. KOKAI Publication No. 2-10467). Developer amounts required by these methods are as follows. In the former method, the film thickness of the developer is set at 1 mm or more, in order to avoid the pullback by which the developer once supplied onto the resist is repelled. Therefore, the developer amount used per 8-inch wafer is 31 ml or more.

The latter method requires 100 ml or more of a developer, because additional amount of developer to substitute water, which is also stored in the liquid agent reservoir, for developer is needed. In contrast, when the method of the present invention is used, the amount of developer can be decreased to 6 ml or less. Accordingly, it is possible to greatly reduce the developer amount used without development performance.

Although a straight nozzle is used in the first embodiment, any nozzle capable of supplying a developer onto a wafer can be used.

In the first embodiment, a plate-like member is used as the developer holder as described above. The merit of this plate-like holder will be described below.

In the development process, a resist which has become soluble dissolves. This resist sometimes sticks to the wall of a vessel and becomes particles. Additionally, the developer is an alkaline aqueous solution. Hence, an alkali component crystallizes by water evaporation or precipitates a carbonate reacting with atmospheric carbon dioxide gas. These crystal and carbonate are also the causes of particles and eventually produce defects. Accordingly, it is important to prevent adhesion of these substances and make simple cleaning possible.

The developer reservoir as disclosed in Jpn. Pat. Appln. KOKAI Publication No. 2-101467 has recesses, projections, valves, and the like for supplying and discharging a developer and rinse solution, i.e., have many members difficult to clean. Therefore, the developer vessel cannot be easily kept clean and require a long cleaning time.

In the present invention, however, the developer holder is a plate-like member and hence can be cleaned using the same way as wafers are usually cleaned. That is, a rinse nozzle is moved to a position above the developer holder, and a rinse solution is dropped while the developer holder is rotated, thereby cleaning the holder surface. This holder surface can be dried by spinning off the rinse solution by increasing the rotational speed. Accordingly, it is readily possible to remove particles and dry the developer holder within short time periods. Keeping the holder surface clean is also easy.

The foregoing is the step of forming a developer film on the developer holder.

Subsequently, a backside of the wafer 10, i.e., an opposite side of a surface 7 coated with the resist (resist surface) is held by the vacuum chuck 2, and the wafer 10 is moved such that the resist surface 7 faces the developer holder 1. First, as shown in FIG. 2B, the wafer 10 is declined to bring the edge of the wafer coated with the resist into contact with the developer film 6. After that, the wafer 10 is brought down to spread the developer film 6 formed on the developer holder 1 by using the interfacial tension between the developer and the wafer 10. If the wettability between the resist and the developer is high, the developer film 6 sequentially comes in contact with the resist surface 7. Since the developer spreads as the developer film 6, no bubble is held. More specifically, the angle between the lower surface of the wafer 10 and the developer holder 1 was initially 15°. Then the wafer 10 is brought down such that this angle between the lower surface of the wafer 10 and the developer holder 1 becomes 0° in three seconds.

When a conventional general developer and resist are used, the contact angle between the resist and the developer is as large as 60° to 75°. When the contact angle is thus large, the resist repels the developer, so a bubble enters between them unless the wafer declining speed is lowered.

Figure 4:
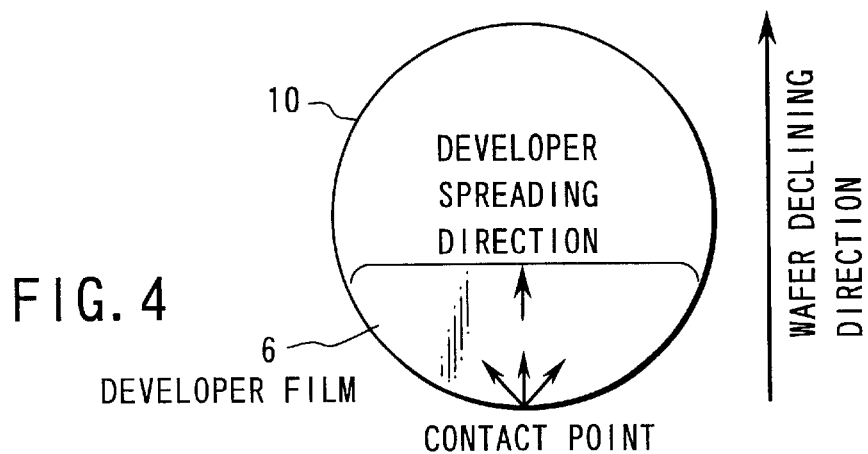
FIG. 4 is a plan view of a wafer, for explaining a developer film formation process of the present invention.
Figure 5:
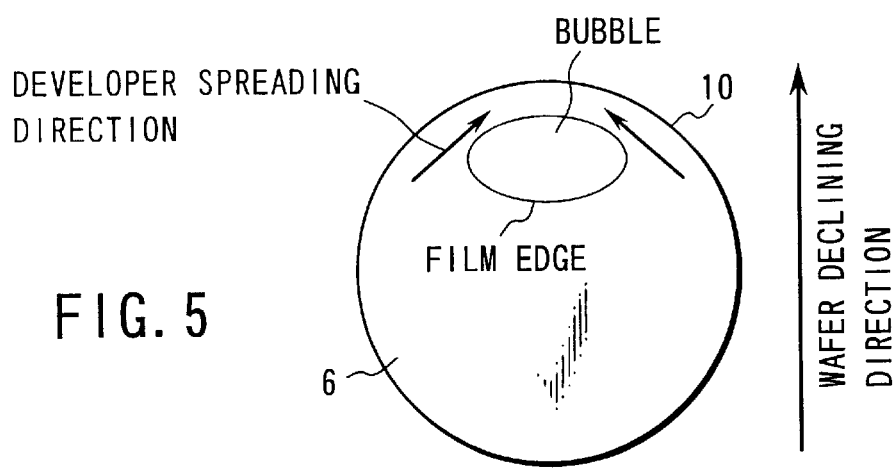
FIG. 5 is a plan view of a wafer, for explaining the mechanism of generating a bubble during the developer film formation process.

The reason why the bubble enters will be explained with reference to FIGS. 4 and 5. FIGS. 4 and 5 are plan views of a wafer, for explaining the developer film formation process of the present invention. When the spread of the developer is observed from the upper side of the wafer by assuming that the wafer 10 is transparent, the ideal developer supply is that the contact boundary of the developer film 6 with the wafer 10 moves from the first contact point (the wafer edge) to the opposite side of the edge as the wafer 10 is brought down (FIG. 4).

If, however, the contact angle between the resist and the developer is larger, as shown in FIG. 5, a place where the developer does not get wet and stops spreading is formed. Unfortunately, the way the developer is repelled differs from one place to another. Therefore, if the developer 6 becomes wet with the resist around the place where the developer stops spreading, air in this place cannot go anywhere and becomes a bubble. This bubble is the cause of a defect.

Even if the generation of a bubble can be avoided because the surrounding liquid surface progresses to well expel the air and the developer is supplied to the portion where the spread of the liquid surface stops, development of that portion lags behind other portions owing to a development time difference or a developer density difference. Consequently, pattern sizes and critical dimensions after development largely vary on the surface of the wafer.

In the first embodiment, therefore, a surfactant is added to the developer so that the contact angle between the resist and the developer is 40° or less. Table 2 shows the results of examination of the entrapment of bubbles when a surfactant is added to the developer to decrease the contact angle between the developer and the resist. When the contact angle between the resist and the developer is 70°, a bubble enters in the latter half when the wafer is gradually declined to bring the developer into contact with the resist. A place where the bubble enters results in a development defect because the place is not developed. When the surfactant is added to set contact angles of 40° and 20°, no bubbles are observed. Hence, the contact angle of the developer must be 40° or less.

TABLE 2

| Contact angle 70° | Bubbles enter when wafer is declined, resulting in development defects |
|---|---|
| Contact angle 40° | No bubbles enter |
| Contact angle 30° | No bubbles enter |

When the contact angle is 40° or less, the developer is not easily repelled by the resist, so no large bubbles remain held even if the wafer declining speed is increased. Therefore, no large development defects caused by the holding of large bubbles occur. Also, when the contact angle between the developer and the resist is 70°, 100 to 200 defects occur per wafer probably because of microbubbles. However, when this contact angle of the developer is 40°, only a few such defects occur per wafer. Furthermore, when the contact angle of the developer is 20°, almost no such defects presumably caused by microbubbles are found.

Figure 6:
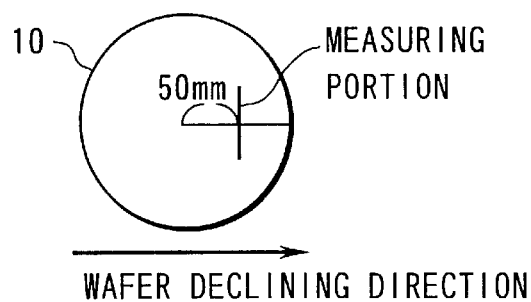
FIG. 6 is a plan view of a wafer, for explaining a developer film thickness measuring portion on the wafer.

In addition, the developer is supplied more smoothly than when the contact angle is large. FIGS. 6, 7A to 7C, and 8A to 8C show the experimental results of examination of the way the developer was supplied. More specifically, as shown in FIG. 6, a wafer was declined to bring a developer diluted to 0.21 N into contact with a resist, and development was stopped within a short time period before the resist was completely developed. The film thickness of the residual resist on a line (±5 mm from the central line) perpendicular to the wafer declining direction was measured in a position 50 mm from the wafer center in the wafer declining direction. Although a negative resist dissolves in a dilute developer, the extent to which the developer is smoothly supplied can be observed by variations in the film thickness of the residual resist. If the developer is smoothly supplied, the variations in the film thickness of the residual resist presumably decrease; if the developer is repelled or non-uniformly supplied because a bubble enters, the variations in the film thickness of the residual resist increase.

Figure 7A:
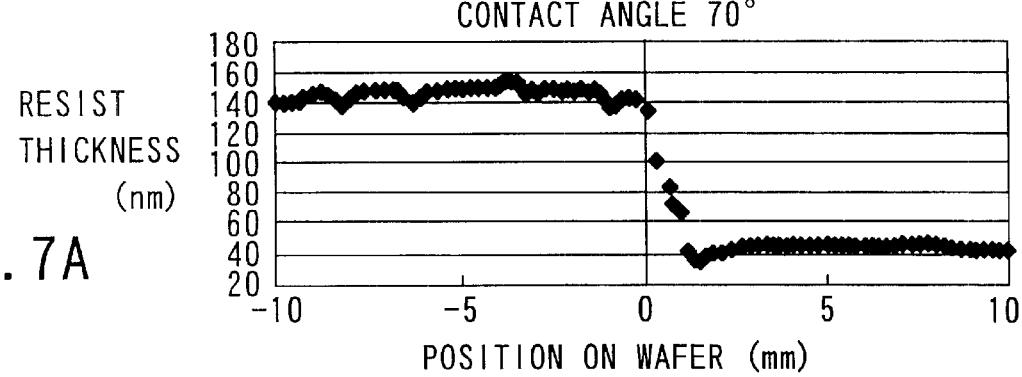

As shown in FIG. 7A, when the contact angle was 70°, a bubble entered the left-hand side of a measuring portion, and the film thickness of the resist was about 150 nm, i.e., the resist was left undeveloped on this side. The developer was sufficiently supplied to the right-hand side of the measuring portion, so the residual film thickness of the resist was only about 40 nm.

Figure 7B:
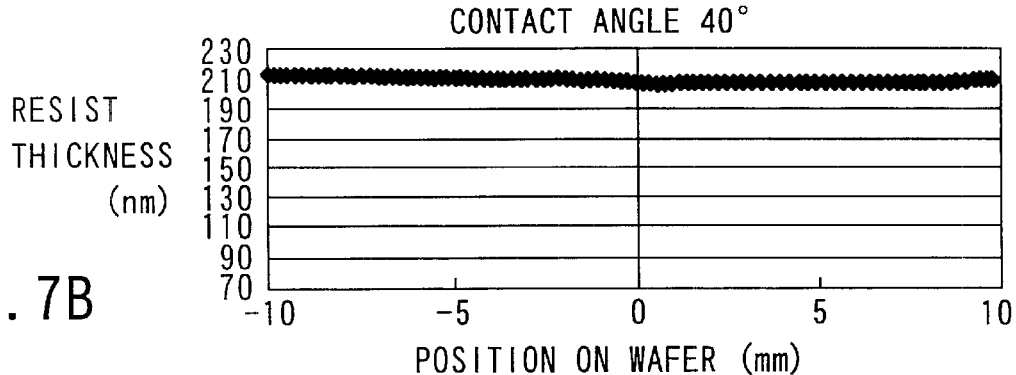
Figure 7C:
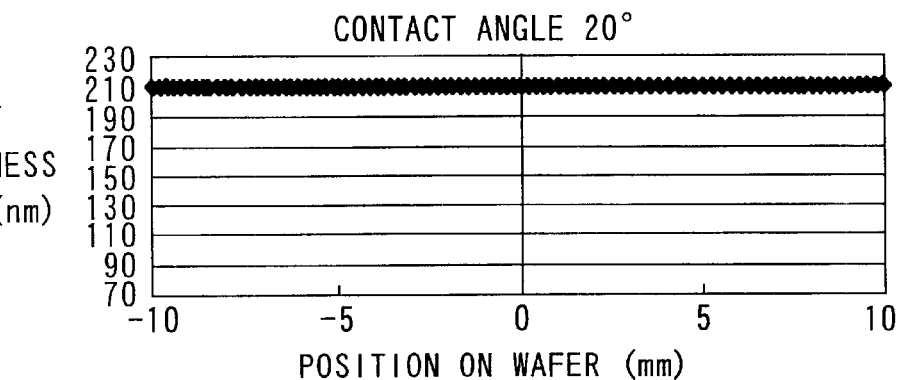

Referring to FIGS. 7B and 7C, the developer was evenly supplied to both the right- and left-hand sides of a measuring portion, so almost no variations occurred in the residual film thickness of the resist. However, in the experiments shown in FIGS. 7A to 7C, the development times were not strictly controlled. Therefore, these values of the residual film thickness cannot be compared between FIGS. 7A to 7C; only variations in the film thickness should be noted.

Figure 8A:
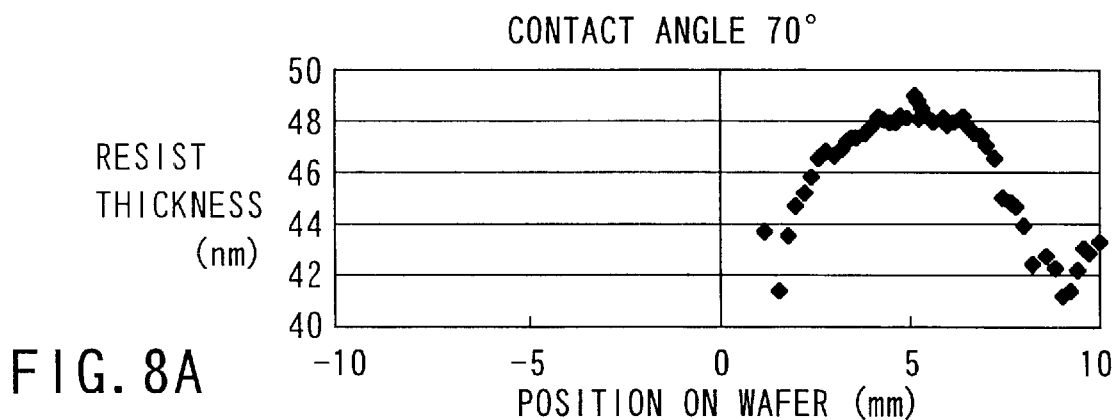
FIGS. 8A, 8B, and 8C are views obtained by partially enlarging the scale on the ordinates of FIGS. 7A, 7B, and 7C, respectively.
Figure 8B:
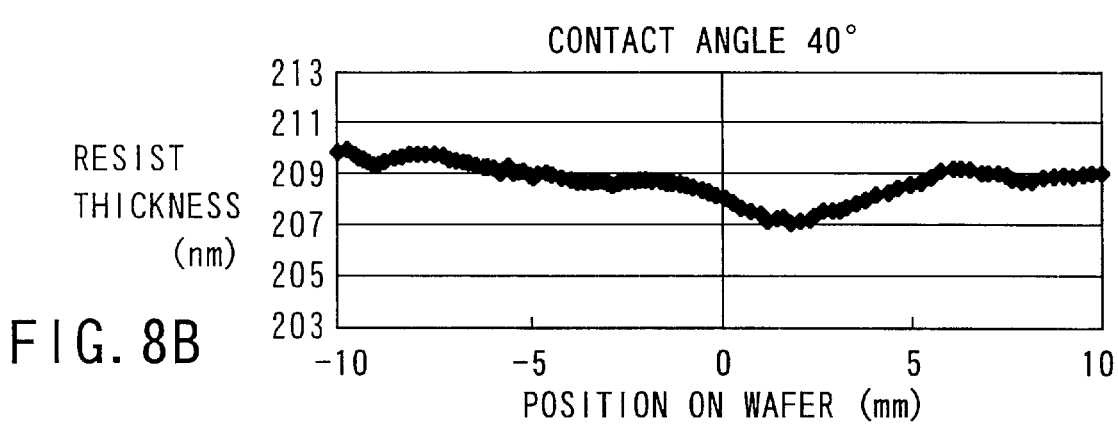
Figure 8C:
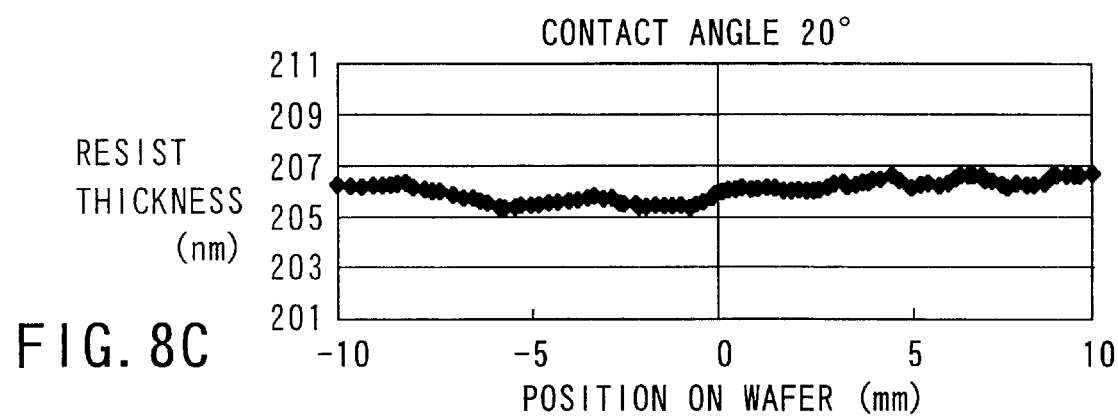

FIGS. 8A to 8C are partially enlarged views of the ordinates of FIGS. 7A to 7C. When the contact angle was 70° (FIG. 8A), film thickness variations were large even on the right-hand side that was well developed. As the contact angle decreased to 40° (FIG. 8B) and 20° (FIG. 8C), film thickness variations decreased.

As the contact angle between the developer and the resist thus decreases, the developer is supplied more smoothly. In practice, the uniformity of pattern sizes or critical dimensions when a developer having a contact angle of 70° was used was compared with that when a developer having a contact angle of 40° was used. As a consequence, when the developer having a contact angle of 70° was used, the dimensional uniformity was 15 nm as a standard variation 3σ even when a portion where a bubble entered was excluded. On the other hand, when the developer having a contact angle of 40° was used, the in-plane uniformity of the pattern sizes or critical dimensions was 6 nm as a standard variation 3σ, i.e., the dimensional uniformity improved.

As the contact angle between the resist and the developer decreases, bubbles do not enter easily any longer, and defects reduce. A contact angle around 40° is the border line of a level having no problem. When the contact angle is 40° or less, no large bubbles enter easily, and only a few microbubbles detectable only with a defect inspection system are found per wafer. Therefore, an appropriate contact angle between the resist and the developer is presumably 40° or less.

In the first embodiment, the contact angle of the developer is decreased by the addition of a surfactant. However, the gist of the addition is to decrease the contact angle between the developer and the resist. Therefore, the contact angle can also be decreased by performing surface processing for the resist, e.g., by coating the resist surface with a hydrophilic film.

The foregoing is the step of supplying the developer onto the entire wafer surface. Subsequently, development is performed for 60 sec by holding a sandwich structure in which the developer is sandwiched between the developer holder and the substrate.

The wafer is then pulled up and rinsed. In the first embodiment, this rinse is performed by moving the wafer to a rinse unit (not shown). That is, the wafer is turned over so that its resist surface faces up, and is transferred to the rinse unit. The wafer is then fixed to a vacuum chuck of the rinse unit. In this rinse unit, a rinse nozzle capable of supplying a rinse solution is fixed to an arm and is thereby movable. After this rinse nozzle is moved to the center of the substrate to be processed, rinse is performed by supplying the rinse solution and rotating the wafer at the same time.

The rinse method is not limited to the above-mentioned method. For example, the rinse solution can be sprayed from below with the wafer resist surface facing down. Also, a step of stopping development by bringing the wafer resist surface into contact with a rinse solution reservoir containing the rinse solution can be performed before the rinse solution is sprayed from below.

After that, the wafer is dried to complete the development step. The wafer is unloaded from the rinse unit and transferred to the cassette station 101 of the coating and development apparatus, thereby completing the resist pattern formation.

Figure 9:
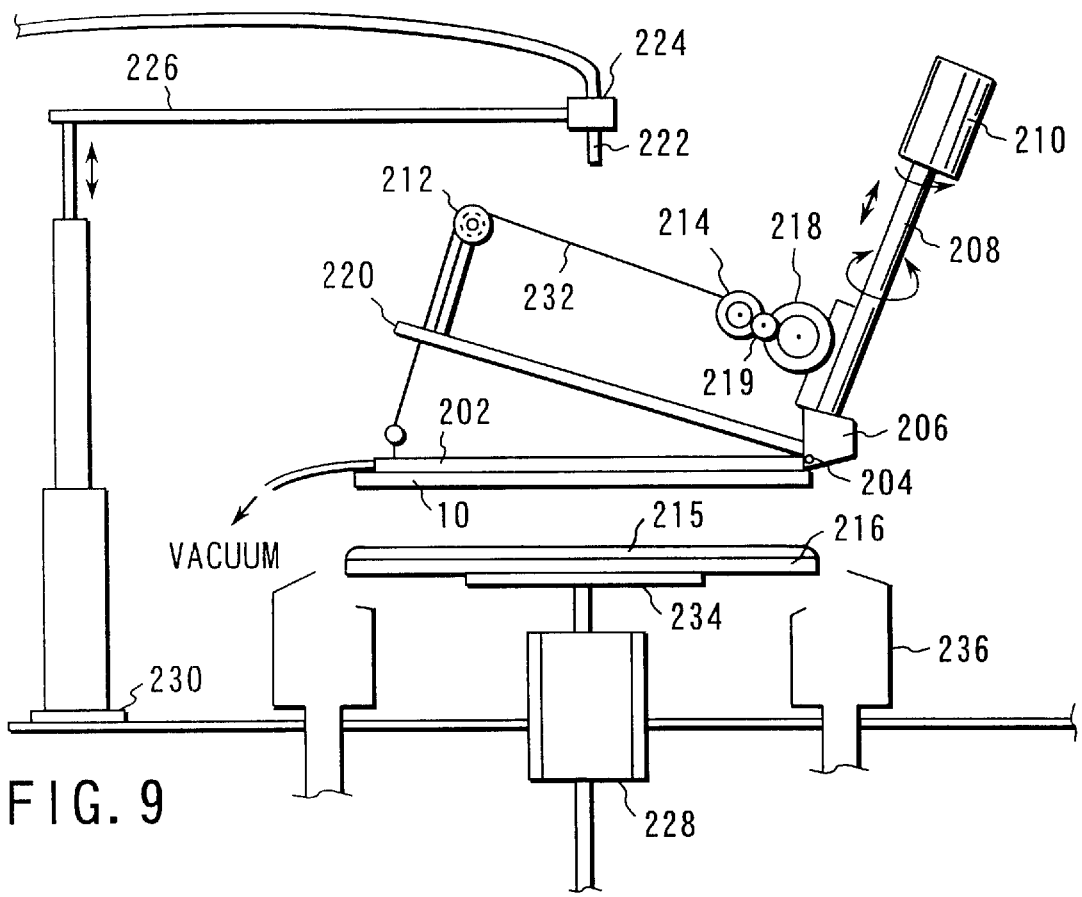
FIG. 9 is a schematic sectional view of a development unit used in the first embodiment.
Figure 10:
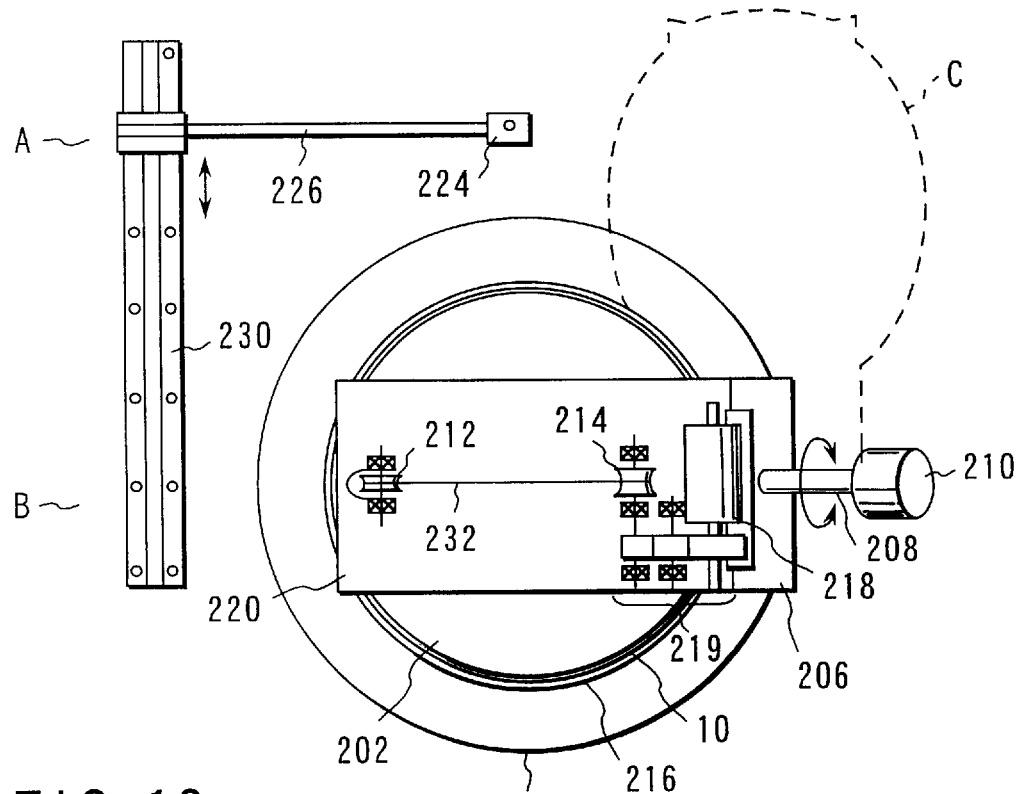
FIG. 10 is a schematic plan view of the development unit used in the first embodiment.

The development unit used in this embodiment will be described below with reference to FIGS. 9 and 10. FIG. 9 is a sectional view of the development unit, and FIG. 10 is a plan view of the development unit. The wafer 10 is fixed to the lower surface of a vacuum chuck 202 such that the resist surface faces down. This vacuum chuck 202 is attached to a support member 206 by a hinge-like, high-precision bearing 204. The support member 206 is fixed to a wafer arm 208.

This wafer arm 208 is connected to a cylinder 210 capable of vertically moving and rotating by charge and discharge of air. The cylinder 210 is a high-precision cylinder having a vibration insulating function for preventing vibrations of the vacuum chuck 202. A motor 218 having a pulley 212 and a spinning wheel 214 is placed above the vacuum chuck 202.

To set the wafer 10 parallel to the upper surface of a developer holder 216, the motor 218 is rotated to loosen its string, and the vacuum chuck 202 is pivoted on the hinge (high-precision bearing) 204, so that the wafer 10 becomes parallel by its own weight to the upper surface of the developer holder 216.

To incline the wafer 10 to the upper surface of the developer holder 216, the motor 218 is rotated in the opposite direction to pull the string, thereby bringing a pulley fixing plate 220 and the vacuum chuck 202 in close contact with each other around the hinge (high-precision bearing) 204. The motor 218 is connected to a DC power supply (not shown) and rotatable in the forward and reverse directions by switching positive and negative.

Speed control is important to gradually decline the wafer 10 after one end portion of the wafer 10 is brought into contact with a developer 215. Gears 219 are placed between the motor 218 and the spinning wheel 214 to increase the torque and decrease the speed. Additionally, the DC current amount of motor 218 is made variable to change the motor rotating speed, thereby controlling the speed at which the wafer 10 declines.

A developer supply nozzle 222 is attached to a nozzle arm 226 by a nozzle holder 224. The nozzle arm 226 is connected to a vertically movable cylinder. This nozzle arm 226 can also horizontally move from a nozzle retraction position A (FIG. 12A) to a developer supply position B by moving on a rail 230.

The developer holder 216 is mounted on a vacuum chuck 234 which can be pivoted by a motor 228. Accordingly, this developer holder 216 can be readily removed and cleaned. Also, a developer falling from the developer holder 216 is collected in a cup 236.

The operation of this development unit will be described below. Initially, the vacuum chuck is lowered in a vacuum chuck retraction position C (a position indicated by the dotted line in FIG. 10). The developer supply nozzle 222 moves along the rail 230 from the nozzle retraction position A to the position B above the developer holder 216, and moves down. While the developer holder 216 is rotated by the motor 228, the developer is supplied to form the developer film 215. When completing the supply of the developer, the developer supply nozzle 222 rises and moves to the nozzle retraction position A along the rail 230.

The lower surface of the vacuum chuck 202 is kept parallel to the upper surface of the developer holder 216. A transferred wafer 200 is fixed to the lower surface of the vacuum chuck 202 such that the resist coated surface faces down. The vacuum chuck 202 is raised by using the cylinder 210, and the wafer arm 208 is rotated, thereby moving the vacuum chuck 202 from the vacuum chuck retraction position C to the upper surface of the developer holder 216.

The motor 218 is rotated to pull a string 232, and the vacuum chuck 202 is raised around the high-precision bearing 204 until this vacuum chuck 202 comes in contact with the pulley fixing plate 220, thereby obliquely holding the wafer 10. With the wafer thus obliquely held, the wafer arm 208 moves down to a position at which one end of the wafer 10 comes in contact with the developer film 215. The motor 218 is rotated in the reverse direction to loosen its string, allowing the wafer 10 to obliquely fall around the high-precision bearing 204. Consequently, the developer film comes in contact with the entire surface of the wafer 10, and development starts.

To complete the development, the wafer arm 208 is raised by using the cylinder 210 and then rotated to move the vacuum chuck 202 to the vacuum chuck retraction position C. The wafer 10 is transferred to an arm (not shown) in the vacuum chuck retraction position A, and transported to the rinse unit (not shown).

In the first embodiment as described above, after a liquid agent film is brought into contact with one end of a substrate to be processed, the substrate is declined to be parallel to the liquid agent holder. This allows a liquid agent to spread over the substrate by the interfacial tension between the liquid agent film and the substrate. Consequently, the liquid agent can be supplied without holding bubbles or causing processing nonuniformity.

(Second Embodiment).

The second embodiment will be described below with reference to FIG. 11.

Figure 11:
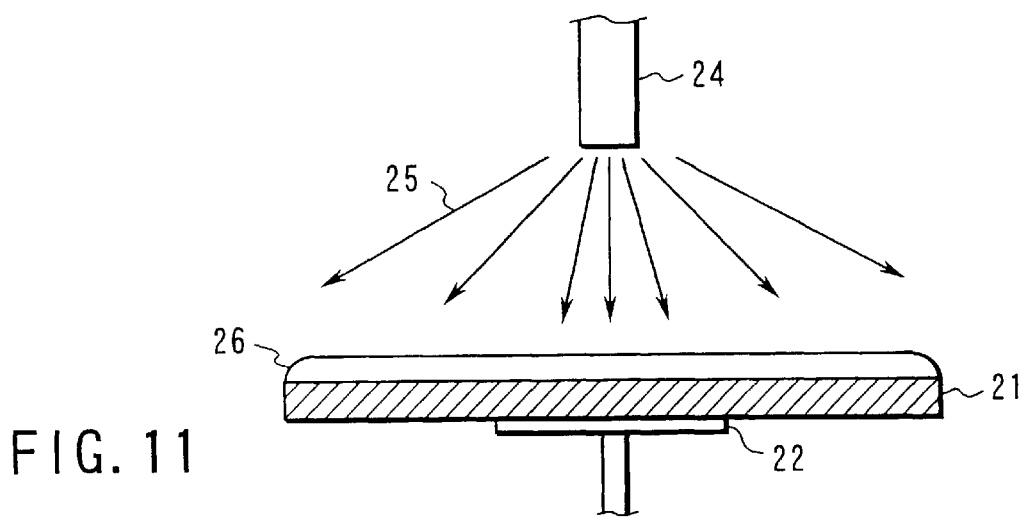
FIG. 11 is a schematic sectional view of a development apparatus using a shower nozzle, for explaining the second embodiment of the present invention.

FIG. 11 is a schematic sectional view of a development apparatus mounting a wafer. This development apparatus uses a method different from that of the first embodiment in which a developer film is formed; while a developer holder 21 is kept unrotated, a developer 25 is supplied from a developer supply nozzle 24. If the contact angle between the developer holder 21 held by a vacuum chuck 22 and the developer is as small as 30° or less, the developer spreads, so a developer film 26 can be formed. Consequently, the thickness of this developer film 26 can be decreased.

If the contact angle between the developer and the developer holder 21 is large, the developer does not spread. Accordingly, no fine liquid film can be formed on the 8-inch developer holder 21 unless the dropping amount of developer is increased. To spread the developer on the 8-inch developer holder 21 within 5 sec by reducing the developer amount to ½ the conventional amount or less, i.e., 15.5 ml or less, the contact angle between the developer holder 21 and the developer must be 30° or less. In this second embodiment, a glass plate which makes a contact angle of 10° with the developer is used as the developer holder 21. The contact angle can also be adjusted by adding a surfactant to the developer.

Figure 12A:
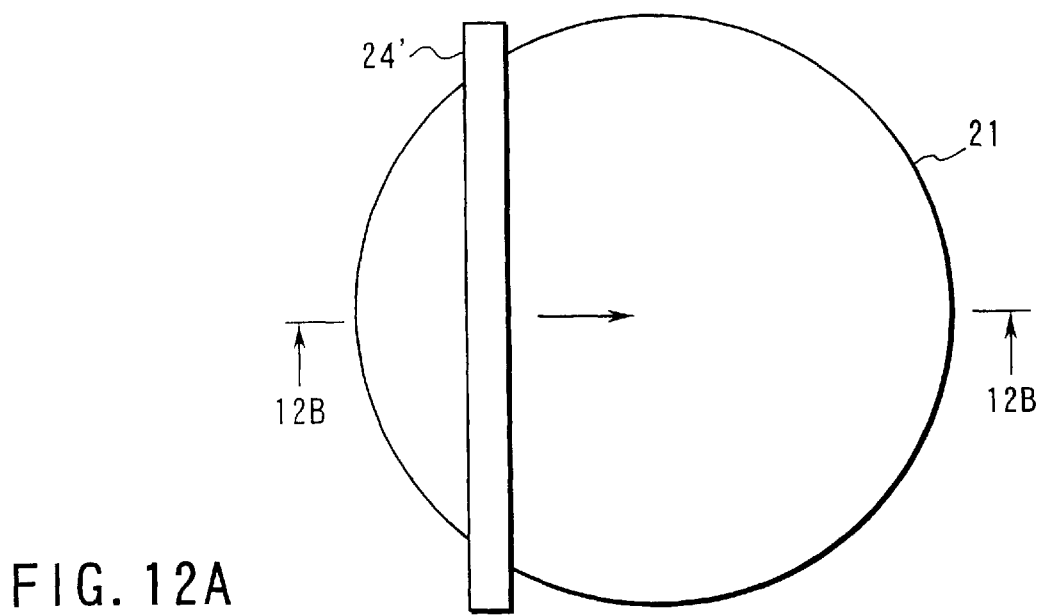
FIG. 12A is a plan view of the development apparatus, for explaining an example of the use of a straight nozzle in the second embodiment.
Figure 12B:
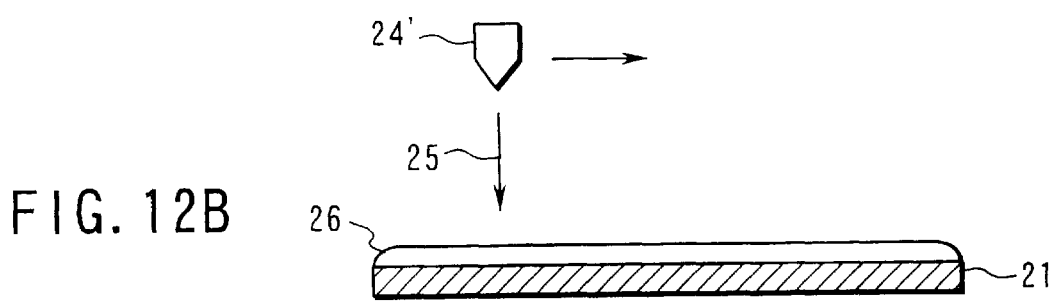
FIG. 12B is a sectional view taken along a line 12B—12B in FIG. 12A.

As shown in FIG. 11, the shower nozzle 24 which spreads a liquid agent at the end of a straight pipe is used as a developer supply nozzle. However, a straight-pipe shower nozzle used in the first embodiment can also be used. Also, the developer can be supplied by moving a linear nozzle 24' having a length substantially the same as the diameter of the developer holder 21 if the developer holder 21 is circular as shown in FIGS. 12A and 12B, (or as the length of one side of the developer holder 21 if the developer holder 21 is square) from one side to the other of the developer holder 21. Although not shown, a large number of nozzle holes are formed in that surface of the linear nozzle, which opposes the developer holder, so that the developer is uniformly supplied onto the upper surface of the developer holder.

After the developer film is formed on the developer holder 21, the operation proceeds on to a step of supplying the developer to an entire wafer surface. The subsequent steps are identical with those of the first embodiment. Even when a developer film is formed as described above, the same effect as in the first embodiment can be obtained.

(Third Embodiment)

The third embodiment will be described below with reference to FIGS. 13A, 13B, 14A, and 14B.

Figure 13A:
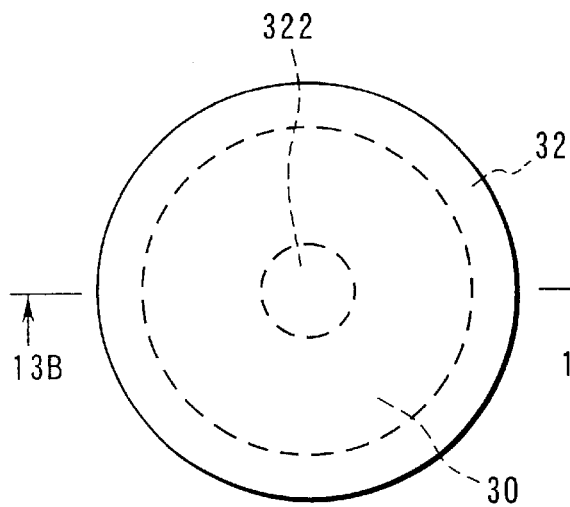
FIG. 13A is a plan view of a development apparatus used in the third embodiment of the present invention.
Figure 14A:
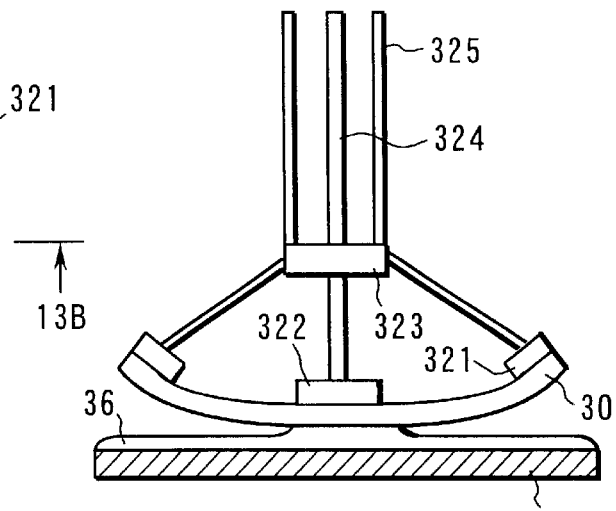
FIGS. 14A and 14B are sectional views of a development apparatus, for explaining a development method of the third embodiment of the present invention step by step.
Figure 13B:
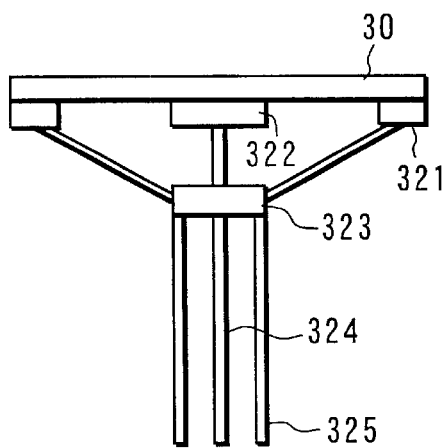
FIG. 13B is a sectional view taken along a line 13B—13B in FIG. 13A.
Figure 14B:
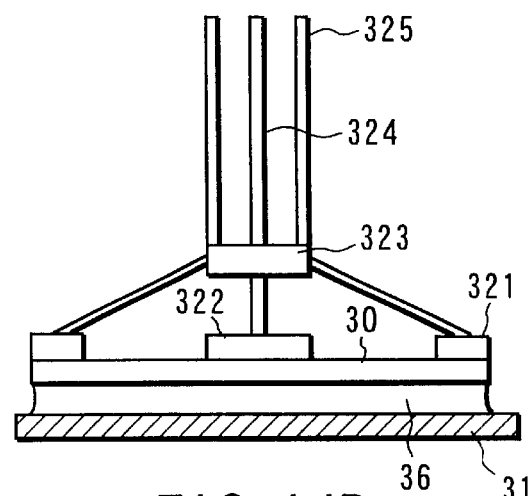
Figure 15:
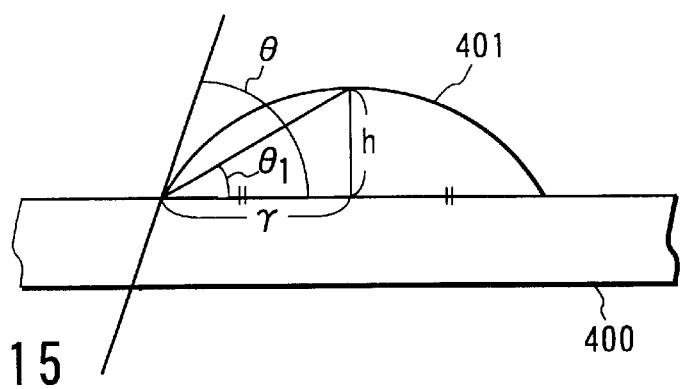
FIG. 15 is a view for explaining a contact angle measurement method.

In this embodiment, a method of supplying a developer to an entire wafer surface from a developer film formed on a developer holder will be explained. FIGS. 13A and 13B are plan and sectional views, respectively, of vacuum chucks for supporting a wafer. FIGS. 14A and 14B are schematic sectional views of a development apparatus which supplies a developer to a wafer by using these vacuum chucks.

First, as shown in FIGS. 13A and 13B, a peripheral portion and central portion of the rear surface of a wafer 30 are fixed by vacuum chucks 321 and 322, respectively. The dotted lines in FIG. 13A indicate the positions of the vacuum chucks 321 and 322 when viewed from the front surface of the wafer 30.

The central vacuum chuck 322 is fixed to a shaft 324. The peripheral vacuum chuck 321 is fixed to an empty ring 323 which is connected to a shaft 325. Vertical motions of the shafts 324 and 325 can be separately controlled.

Subsequently, as shown in FIG. 14A, the wafer 30 is deformed by projecting the central vacuum chuck 322 such that the central portion of the wafer 30 is recessed. With this shape maintained, the wafer 30 is lowered facing down such that only the recess comes in contact with a developer film 36.

After that, as shown in FIG. 14B, only the peripheral vacuum chuck 321 is moved down to flatten the wafer 30. As a consequence, the developer film 36 spreads from the center to the perimeter on the basis of the interfacial tension between the developer and a resist (not shown) formed on the lower surface of the wafer 30. By this method, the developer film 36 can be spread without holding bubbles into the developer film 36.

The method of supplying a developer to an entire wafer surface described in the present invention is basically as follows. A portion of a developer film and a portion of a wafer are brought into contact with each other by moving a developer holder or the wafer or by deforming the wafer. After that, the wafer is set parallel to the developer holder. In this state, the place where the developer film comes in contact with the portion of the wafer acts as a starting point (contact point), and the developer film spreads from this point by the interfacial tension between the developer and a resist. Therefore, the developer film spreads without holding bubbles. The position of the initial starting point is not limited to that described in the above embodiments as long as the wafer and the developer holder can be made parallel to each other so that bubbles can go away when the developer film spreads from the starting point.

The method of moving the wafer 10 while fixing the developer holder 1 is described above. However, the developer holder 1 may be moved such that the developer film 6 thereon comes into contact with the recessed central portion of the wafer.

In the first to third embodiments, the liquid agent processing is explained by taking the step of developing a photosensitive resin as an example. However, the liquid agent processing is not restricted to this step. For example, the present invention is applicable to liquid agent processing such as a step of wet-etching a chromium mask for exposure and a step of removing a native oxide film from a silicon wafer. The present invention is also applicable to processing of, e.g., a liquid crystal and a compact disc (CD), in addition to a wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method comprising:
   supplying a liquid agent onto a liquid agent holder having a continuous solid and planar upper surface to form a liquid agent film on the planar upper surface of said liquid agent holder;
   setting a substrate to be processed such that a surface to be processed of said substrate opposes said liquid agent film on the planar upper surface of said liquid agent holder;
   bringing the surface to be processed of said substrate into contact with said liquid agent film at one point; and
   gradually spreading the contact from said one point as a starting point until the surface to be processed of said substrate entirely comes in contact with said liquid agent film.

2. A method according to claim 1, further comprising making preparations such that a contact angle between the surface to be processed of said substrate and said liquid agent is not more than 40°.

3. A method according to claim 2, wherein said gradually spreading the contact comprises making said substrate parallel to the planar upper surface of said liquid agent holder while holding the contact at said one point, and spreading said liquid agent film over an entire surface to be processed by using an interfacial tension between said liquid agent film and said substrate.

4. A method according to claim 2, wherein
said bringing the surface to be processed of said substrate into contact with said liquid agent film at one point comprises declining said substrate such that an edge of the surface to be processed of said substrate comes in contact with said liquid agent film, and
said gradually spreading the contact comprises bringing said substrate down to make said substrate parallel to an upper surface of said liquid agent film, while the edge of the surface to be processed of said substrate is in contact with said liquid agent film, thereby spreading said liquid agent as a liquid film over an entire surface to be processed by using an interfacial tension between said liquid agent film and said substrate.

5. A method according to claim 2, wherein
said bringing the surface to be processed of said substrate into contact with said liquid agent film at one point comprises bringing said substrate and said liquid agent film into contact with each other by warping said substrate such that a center of said substrate projects toward said liquid agent holder, and
said gradually spreading the contact comprises canceling the warp of said substrate such that said substrate is parallel to the planar upper surface of said liquid agent holder, while a center of said substrate is in contact with said liquid agent film, thereby spreading said liquid agent as a liquid film over an entire surface to be processed by using an interfacial tension between said liquid agent film and said substrate.

6. A method according to claim 2, wherein said making preparations such that a contact angle between the surface to be processed of said substrate and said liquid agent is not more than 40° comprises adding a surfactant to said liquid agent.

7. A method according to claim 2, wherein said making preparations such that a contact angle between the surface to be processed of said substrate and said liquid agent is not more than 40° comprises performing surface treatment of reducing the contact angle on the surface to be processed.

8. A method according to claim 1, wherein said forming a liquid agent film on the planar upper surface of said liquid agent holder comprises supplying said liquid agent on the planar upper surface of said liquid agent holder from above while rotating said liquid agent holder.

9. A method according to claim 8, further comprising preparing said liquid agent holder the planar upper surface of which makes a contact angle of not more than 30° with said liquid agent.

10. A method according to claim 1, further comprising preparing said liquid agent holder the planar upper surface of which makes a contact angle of not more than 30° with said liquid agent,
wherein said forming a liquid agent film on the planar upper surface of said liquid agent holder comprises forming said liquid agent film by supplying said liquid agent on the planar upper surface of said liquid agent holder from above while said liquid agent holder is at rest.

11. A method according to claim 1, wherein said forming liquid agent film on the planar upper surface of said liquid agent holder comprises supplying said liquid agent by moving a linear nozzle having substantially the same length as a width or a diameter of said liquid agent holder from one end to the other of said liquid agent holder.

12. A substrate processing apparatus comprising:
a liquid agent holder having a continuous solid and planar upper surface;
a liquid agent supply mechanism configured to supply a liquid agent onto the planar upper surface of said liquid agent holder to form a liquid agent film on the planar upper surface of said liquid agent holder;
a holding mechanism configured to hold a substrate to be processed such that a surface to be processed of said substrate opposes the planar upper surface of said liquid agent holder;
a first driving mechanism configured to move at least one of said liquid agent holder and said substrate to bring an end portion of the surface to be processed of said substrate into contact with said liquid agent film; and
a second driving mechanism configured to move said substrate so as to gradually spread the contact from said end portion of the surface to be processed as a starting point, until the surface to be processed of said substrate entirely comes in contact with said liquid agent film.

13. An apparatus according to claim 12, wherein said liquid agent supply mechanism comprises a mechanism which supplies said liquid agent through a straight nozzle placed above substantially a center of the planar upper surface of said liquid agent holder while rotating said liquid agent holder.

14. An apparatus according to claim 12, wherein the planar upper surface of said liquid agent holder is so set as to make a contact angle of not more than 30° with said liquid agent.

15. An apparatus according to claim 12, wherein said liquid agent supply mechanism comprises a shower nozzle placed above substantially a center of the planar upper surface of said liquid agent holder.

16. An apparatus according to claim 12, wherein said liquid agent supply mechanism comprises a mechanism which supplies said liquid agent by moving a linear nozzle having substantially the same length as a width or a diameter of said liquid agent holder from one end to the other of said liquid agent holder.

17. An apparatus according to claim 12, wherein said holding mechanism for holding said substrate comprises a third driving mechanism which retracts said substrate to substantially an outside of said liquid agent holder while said liquid agent supply mechanism is supplying said liquid agent to said liquid agent holder.

18. A substrate processing apparatus comprising:
a liquid agent holder having a planar upper surface;
a liquid agent supply mechanism configured to supply a liquid agent onto the planar upper surface of said liquid agent holder to form a liquid agent film on said liquid agent holder;
a holding mechanism configured to hold a substrate to be processed such that a surface to be processed of said substrate opposes said liquid agent film on the planar upper surface of said liquid agent holder;
a first driving mechanism configured to curve the surface to be processed of said substrate into a shape of a projection and bringing an end portion of the projection of the surface to be processed into contact with said liquid agent film; and
a second driving mechanism configured to cancel the curve of said substrate so as to gradually spread the contact from a contact point between the surface to be processed and said liquid agent as a starting point, until the surface to be processed of said substrate entirely comes in contact with said liquid agent film.

19. An apparatus according to claim 18, wherein said liquid agent supply mechanism comprises a mechanism which supplies said liquid agent through a straight nozzle placed above substantially a center of the planar upper surface of said liquid agent holder while rotating said liquid agent holder.

20. An apparatus according to claim 18, wherein the planar upper surface of said liquid agent holder is so set as to make a contact angle of not more than 30° with said liquid agent.

21. An apparatus according to claim 18, wherein said liquid agent supply mechanism comprises a shower nozzle placed above substantially a center of the planar upper surface of said liquid agent holder.

22. An apparatus according to claim 18, wherein said liquid agent supply mechanism comprises a mechanism which supplies said liquid agent by moving a linear nozzle having substantially the same length as a width or a diameter of said liquid agent holder from one end to the other of said liquid agent holder.

23. An apparatus according to claim 18, wherein said holding mechanism configured to hold a substrate comprises a third driving mechanism which retracts said substrate to substantially an outside of said liquid holder while said liquid agent supply mechanism is supplying said liquid agent to said liquid agent holder.

* * * * *